United States Patent [19]

Curti

[11] Patent Number: 4,700,488
[45] Date of Patent: Oct. 20, 1987

[54] ARRANGEMENT FOR ALIGNING A PRINTED CIRCUIT SUBSTRATE IN A PRINTING MACHINE

[76] Inventor: Ezio Curti, Strada Padana Superiore 57/59, I-20063 Cenusco s/N., Milan, Italy

[21] Appl. No.: 828,778
[22] Filed: Feb. 12, 1986

[30] Foreign Application Priority Data

Feb. 14, 1985 [IT] Italy .............................. 19514 A/85

[51] Int. Cl.⁴ .......................... B23Q 3/00; B25B 11/00
[52] U.S. Cl. ........................................ 33/613; 33/614; 269/21; 269/48.4; 269/50; 269/903
[58] Field of Search ................... 33/180 R, 184.5, 520; 269/21, 48.1, 48.2, 48.3, 48.4, 50, 52, 53, 54.1, 54.5, 903

[56] References Cited

U.S. PATENT DOCUMENTS

| | | | |
|---|---|---|---|
| 2,099,364 | 11/1937 | Hunter | 33/184.5 |
| 3,381,554 | 5/1968 | Ploch et al. | 33/184.5 |
| 3,460,822 | 8/1969 | Link | 269/21 |
| 3,574,946 | 4/1971 | Mayston et al. | 33/184.5 |
| 3,798,782 | 3/1974 | Lindahl | 33/184.5 |
| 4,017,793 | 4/1977 | Haines | 269/21 |
| 4,244,109 | 1/1981 | Silverman | 33/180 R |

FOREIGN PATENT DOCUMENTS 545786 4/1977 U.S.S.R. .............................. 269/48.4

Primary Examiner—Richard R. Stearns
Attorney, Agent, or Firm—Peter K. Kontler

[57] ABSTRACT

A substrate to be imprinted with a printed circuit has a pair of locating holes. The substrate is aligned and fixed relative to the drum of a screen printing machine via a pair of aligning and fixing devices each of which has a locating pin receivable in a locating hole. Each of the locating pins is axially divided into two parts which are urged into engagement with one another via a set of springs but can be spread apart against the action of the springs. When the two parts of a pin are in contact with each other, the width or diameter of the pin is substantially smaller than the diameter of the respective locating hole. On the other hand, the width or diameter of each pin in the spread condition equals the diameter of the associated locating hole. The substrate is placed on the aligning and fixing devices while the two parts of each pin engage one another so that the pins can be readily received in the locating holes. Once the pins are in the holes, the pins are spread to thereby align and fix the substrate in the printing machine.

27 Claims, 7 Drawing Figures

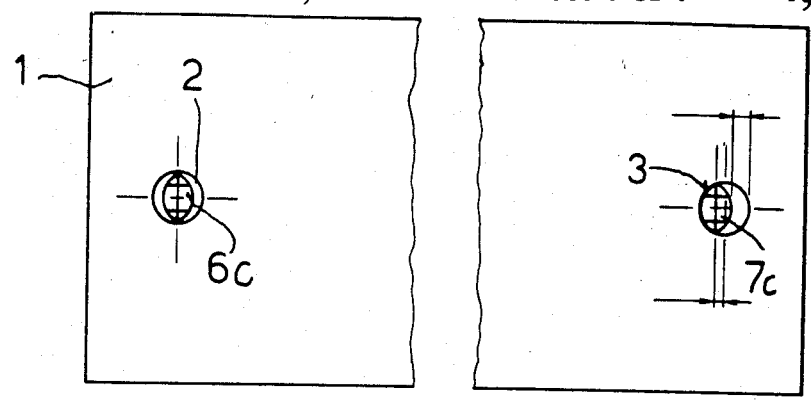
Fig. 4
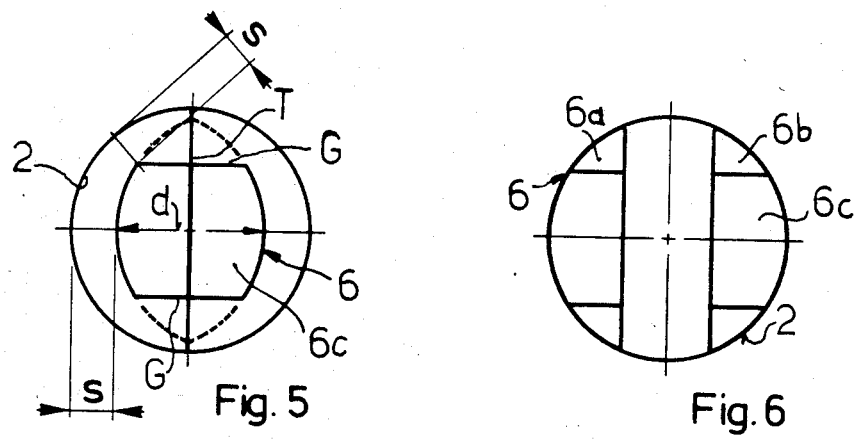
Fig. 5        Fig. 6
Fig. 7
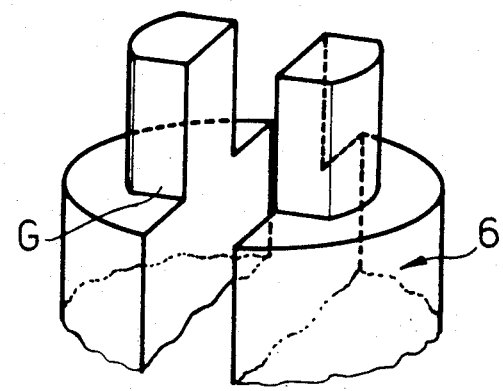

ARRANGEMENT FOR ALIGNING A PRINTED CIRCUIT SUBSTRATE IN A PRINTING MACHINE

BACKGROUND OF THE INVENTION

The invention relates generally to an arrangement for aligning a substrate preparatory to imprinting the substrate with a printed circuit.

More particularly, the invention relates to the alignment of a substrate having locating holes which are designed to receive locating pins.

Screen printing is a conventional technique for applying a printed circuit to a substrate. In order to precisely position the substrate for printing, it has become the practice to provide the substrate with small locating holes which receive locating pins provided in the printing machine. The locating pins, which have a diameter of a few millimeters, are adjusted relative to the printing unit and the substrate is then positioned so that the locating holes are in register with and receive the locating pins.

Although alignment of a substrate by means of locating pins has proved to be highly satisfactory, this procedure poses a problem in automatic machines. The reason is that such machines operate at ever-increasing speeds. Thus, it has been found difficult to rapidly align a substrate in a high-capacity machine using locating holes and cooperating fixed locating pins.

A difficulty which arises is that of inserting the locating pins in the locating holes. This difficulty is due in part to the very small dimensions of the locating pins and locating holes. Furthermore, deformation of the substrate contributes to the difficulty of inserting the locating pins in the locating holes. The substrate undergoes changes in length when it is subjected to temperature fluctuations and this, in turn, causes the relative positions of the locating holes to change.

As a result of the problems associated with insertion of the locating pins in the locating holes, the high output capacity of a modern printing machine cannot be fully utilized. There are continual interruptions in the supply of substrates to, and also in the automatic alignment and fixing of the substrates in, the machine. Moreover, the locating pins are subject to damage which can cause the electronic circuit applied to a substrate by screen printing to be out of register.

OBJECTS AND SUMMARY OF THE INVENTION

It is an object of the invention to provide an arrangement which makes it possible to rapidly align and fix a substrate in a printing machine.

Another object of the invention is to provide an arrangement which enables a substrate to be aligned and fixed in a printing machine with a high degree of precision.

An additional object of the invention is to provide an arrangement which permits a substrate with locating holes to be rapidly as well as precisely aligned and fixed in a printing machine by means of locating pins.

A further object of the invention is to provide an aligning and fixing arrangement having locating pins which are receivable in locating holes of a substrate and are capable of eliminating all, or virtually all, play between the locating holes and cooperating locating pins.

It is also an object of the invention to provide an aligning and fixing arrangement having locating pins which are receivable in locating holes of a substrate and are capable of compensating for length changes as well as other deformation of the substrate.

The preceding objects and others are achieved by the invention.

One aspect of the invention resides in an arrangement for aligning a substrate preparatory to imprinting the latter with a printed circuit. The substrate has a plurality of locating holes, and the arrangement comprises a plurality of locating pins each of which has an end portion arranged to be received in a respective locating hole. Each of the end portions has a contracted condition in which the end portion is receivable in the respective locating hole with clearance, and each of the end portions further has an expanded condition. Operating means is associated with each of the locating pins for urging the respective end portion from the contracted condition to the expanded condition and vice versa.

In a preferred embodiment of the invention, each of the locating pins is axially divided into at least two parts which are relatively movable transverse to the respective pin between a first position in which the parts are nearer one another and a second position in which the parts are farther away from each other. The end portions of the respective locating pins then assume the contracted condition in the first position of the respective parts and the expanded condition in the second position of the latter. The operating means for each locating pin here includes a guide for the respective pin, and resilient biasing elements on the guide which are arranged to urge the respective parts of the pin to the first position. The guides are preferably in the form of sleeves which receive the respective locating pins with clearance when the parts of the locating pins are in the first position. Each locating pin is provided with an axially extending passage having a first end remote from and a second end nearer to the end portion of the respective pin, and the second end of each passage converges in a direction towards the respective end portion. Each operating means further includes a rod in the respective passage, and moving means for moving the rod axially of the passage. The moving means for each rod comprises a piston-and-cylinder unit, and each rod has a driven end which is fast with the piston of the respective unit. It is preferred for the piston-and-cylinder units to be pneumatic units. Each rod also has a tip which faces the second end of the respective passage and converges in a direction towards the end portion of the respective locating pin. The second ends of the passages and the tips of the rods advantageously have conical configurations.

A locating pin in accordance with the invention may be designed so as to be substantially smaller than the corresponding locating hole in the contracted condition. The locating pin may then be inserted in the locating hole while in this condition. After insertion in the locating hole, the locating pin may be spread apart or expanded to thereby precisely fix a substrate to be imprinted in the desired position. Expansion of the locating pin may be carried out automatically. The locating pin may be designed to be elastically deformable.

The novel features which are considered as characteristic of the invention are set forth in particular in the appended claims. The improved aligning and fixing arrangement itself, however, both as to its construction and its mode of operation, together with additional features and advantages thereof, will be best understood upon perusal of the following detailed description of certain specific embodiments with reference to the accompanying drawings.

BRIEF DESCRIPTION OF THE DRAWINGS

FIG. 4 is a fragmentary plan view of FIG.

FIG. 5 is an enlarged plan view of one of the locating holes and locating pins of FIG. 2;

FIG. 6 is an enlarged plan view of one of the locating holes and locating pins of FIG. 3; and FIG. 7 is a fragmentary perspective view of one of the locating pins of FIGS. 1–4 illustrating the end portion of the pin which is receivable in a locating hole.

DESCRIPTION OF THE PREFERRED EMBODIMENTS

Figure 1:
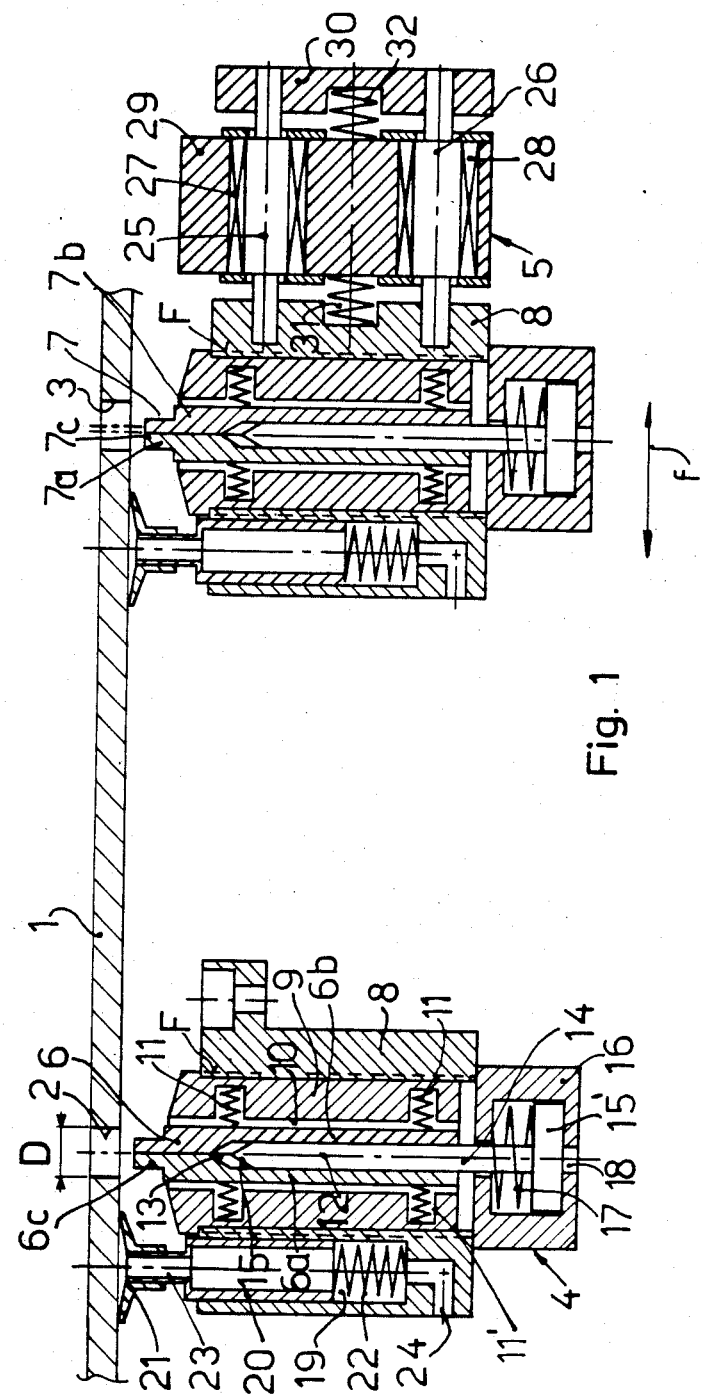
FIG. 1 is a schematic cross-sectional view of an aligning and fixing arrangement in accordance with the invention showing a pair of contracted locating pins prior to insertion in the locating holes of a substrate to be imprinted with a printed circuit.

Referring to FIG. 1, the reference numeral 1 identifies a substrate or plate 1 which is to be imprinted with a printed circuit in a screen printing machine. In order for the printed circuit to be properly positioned on the substrate 1, the substrate 1 must be aligned and fixed relative to the printing unit or drum. To this end, the substrate 1 is provided with locating holes 2 and 3 while the printing machine is provided with an aligning and fixing arrangement including aligning and fixing devices 4 and 5 having respective locating pins 6 and 7 which are respectively receivable in the locating holes 2 and 3. The aligning and fixing devices 4,5 are disposed below the substrate 1.

The parts of the printing machine other than the aligning and fixing devices 4,5 have been omitted for the sake of clarity.

The aligning and fixing device 4 comprises a support 8 which is secured to the non-illustrated frame of the screen printing machine via suitable fastening means, e.g., screws. The screen printing machine operates automatically, that is, the substrate 1 is automatically imprinted with a printed circuit in the machine.

The support 8 carries a sleeve-like member or sleeve 9 having an axially extending bore 10. The locating pin 6 is accommodated in the bore 10 with a small radial clearance, i.e., the outer surface of the locating pin 6 and the inner surface of the sleeve 9 together define a narrow gap extending circumferentially of the locating pin 6. The sleeve 9 may be threaded into the support 8 as indicated at F.

The locating pin 6 is axially divided into two halves or parts 6a and 6b. In order to hold the parts 6a and 6b together, the sleeve 9 is provided with a series of internal, radially extending bores 11' each of which confines a resilient biasing element in the form of a spring 11. The springs 11 bear against the locating pin 6 and react against the sleeve 9 to thereby urge the parts 6a,6b of the pin 6 into engagement with one another.

Figure 2:
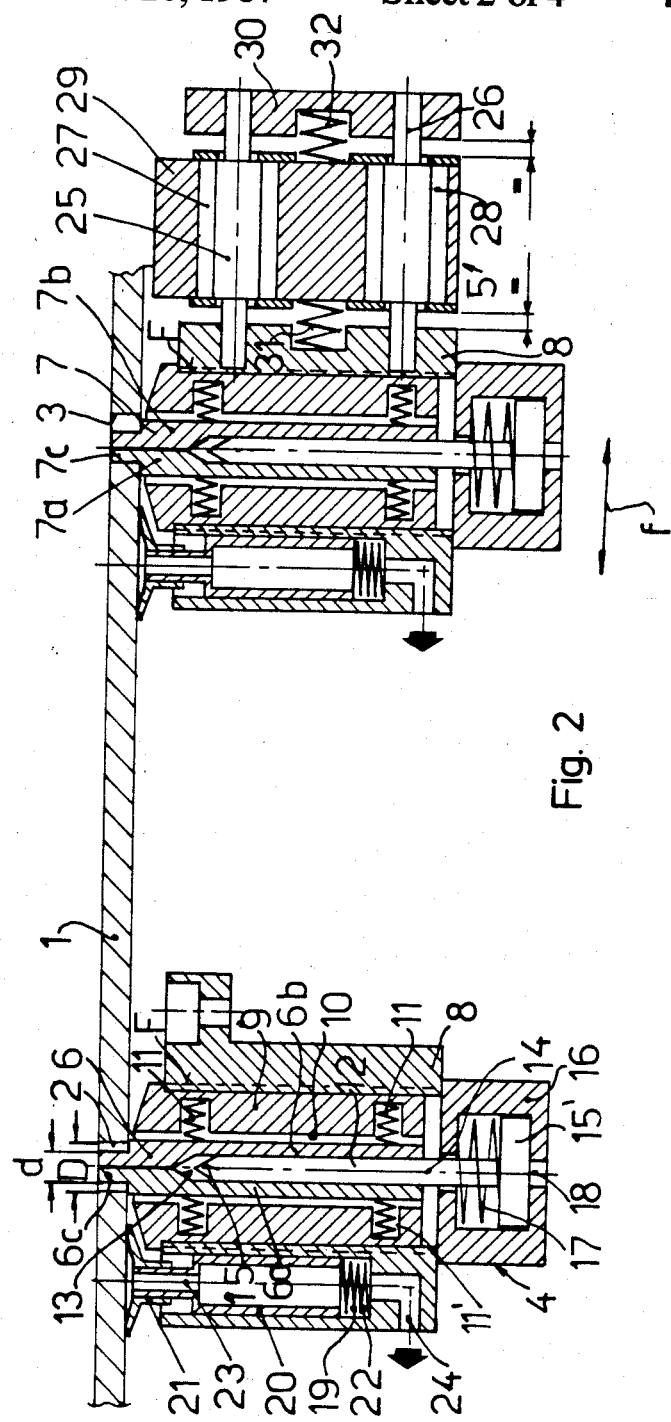
FIG. 2 is similar to FIG. 1 but illustrates the contracted locating pins after insertion in the locating holes.

The locating pin 6 has an end portion or peg 6c which is receivable in the locating hole 2 of the substrate 1. As best seen in FIG. 2, the peg 6c has a width or diameter d which is substantially smaller than the diameter D of the locating hole 2.

The locating pin 6 is provided with an internal, axially extending passage 12 having an open end remote from the peg 6c and a closed end 13 nearer the peg 6c. The closed end 13 has a conical configuration and converges in a direction towards the peg 6c. A rod 14 is slidably mounted in the passage 12 for movement in axial direction of the latter. The rod 14 has a conical tip 15 which faces the closed end 13 of the passage 12 and again converges in a direction towards the peg 6c of the locating pin 6.

The rod 14 constitutes the piston rod of a pneumatic piston-and-cylinder unit mounted at the underside of the support 8. The piston-and-cylinder unit comprises a cylinder 16, and a piston 15' arranged to ride in the cylinder 16. The end of the rod 14 remote from the tip 15 is secured to the piston 15'. The cylinder 16 has an opening 18 which is connected with a non-illustrated source of compressed air and confronts the lower surface of the piston 15'. A resilient member in the form of a return spring 17 is located on that side of the piston 15' remote from the opening 18. The spring 17 bears against the upper surface of the piston 15' and reacts against the cylinder 16 thereby urging the tip 15 of the rod 14 away from the closed end 13 of the passage 12.

The support 8 is provided with a guide passage 19 to one side of the locating pin 6. The guide passage 19, which extends parallel to the locating pin 6, accommodates a tubular member or tube 20. The tube 20 is mounted for movement in the axial direction of the guide passage 19. The upper end of the tube 20 carries a suction device or suction head 21 which faces the underside of the substrate 1 and has a suction passage 23. The lower end of the tube 20, on the other hand, rests on an elastic element in the form of a spring 22 which is located in, and bears against a surface delimiting the lower end of, the guide passage 19. The spring 22 urges the tube 20, and hence the suction head 21, upwards. When the upper surface of the peg 6c is located below the substrate 1 as shown in FIG. 1, the spring 22 causes the suction head 21 to assume a position above that of the peg 6c.

The support 8 is further provided with a channel 24 having one end which communicates with the guide passage 19 and another end which is designed to be connected with a non-illustrated source of suction. A negative pressure can thus be created in the suction head 21 via the channel 24, the guide passage 19, the tube 20 and the suction passage 23 so that the suction head 21 can attract and grip the substrate 1.

The aligning and fixing device 5 includes all of the components described above for the aligning and fixing device 4. Accordingly, a repetition of the preceding description with reference to the aligning and fixing device 5 is unnecessary. It is to be observed, however, that the locating pin associated with the aligning and fixing device 5 is identified by the reference numeral 7. Similarly to the locating pin 6, the locating pin 7 is axially divided into two halves or parts 7a and 7b. The locating pin 7 is arranged to cooperate with the locating hole 3 in the substrate 1 and has an end portion or peg 7c which is receivable in the locating hole 3. The peg 7c again has a width or diameter d which is substantially smaller than the diameter D of the locating hole 3.

Figure 3:
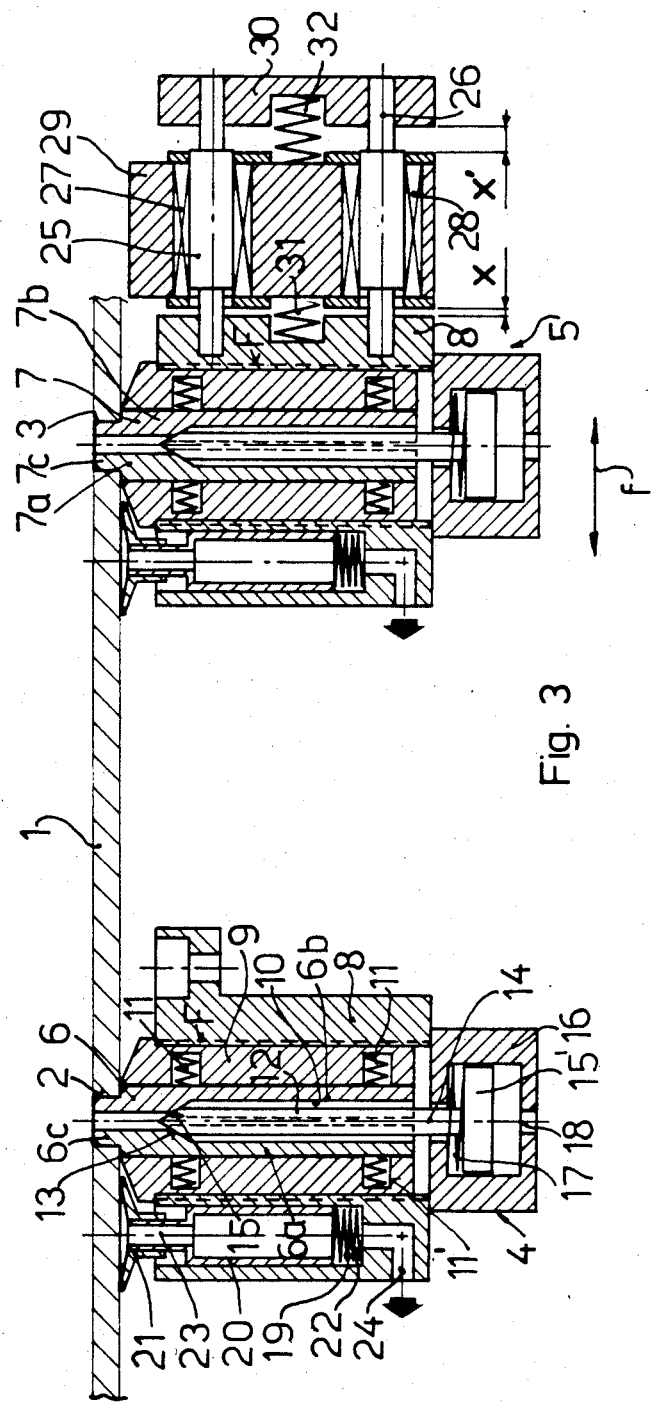
FIG. 3 is similar to FIG. 2 but shows the locating pins in expanded condition.

The aligning and fixing device 5 differs from the aligning and fixing device 4 in that the support 8 of the device 5 is not fixed to the frame of the screen printing machine. Instead, the support 8 of the aligning and fixing device 5 is movable in a direction transverse to the locating pins 6,7, namely, in a horizontal direction as seen in FIGS. 1-3. To this end, a pair of rod-like guide members or shafts 25 and 26 is mounted on the support 8 of the device 5. The shafts 25,26, which are disposed horizontally, extend in parallelism with one another and together define a vertical plane. The shafts 25,26 are respectively mounted in conventional bearings 27 and 28, e.g., roller bearings, for horizontal displacement. The bearings 27,28, in turn, are carried by a mounting member 29 which is fast with the frame of the screen printing machine.

The ends of the shafts 25,26 remote from the support 8 of the aligning and fixing device 5 project to the side of the mounting member 29 opposite the support 8. The projecting ends of the shafts 25,26 are fixedly connected with one another by means of a transverse yoke 30.

One or more elastic members in the form of a spring or springs 31 may advantageously be disposed between the mounting member 29 and the support 8 of the device 5. Similarly, it is of advantage to arrange one or more elastic members in the form of a spring or springs 32 between the mounting member 29 and the yoke 30. The springs 31,32 are designed and adjusted in such a manner that, in the absence of external forces on the springs 31,32, the force exerted by the spring or springs 31 is equal to that exerted by the spring or springs 32. In other words, the spring or springs 31 have the same spring constants and prestresses as the spring or springs 32. This insures that the support 8 of the aligning and fixing device 5 always assumes the same position relative to the mounting member 29 when no external horizontal forces act on the support 8 and the yoke 30. The position of the support 8 relative to the mounting member 29 in the absence of external horizontal forces is shown in FIGS. 1 and 2. In this rest position of the support 8, the width of the gap between the support 8 and the mounting member 29 approximates or equals the width of the gap between the mounting member 29 and the yoke 30 as illustrated in FIG. 2.

The operation of the aligning and fixing arrangement including the aligning and fixing devices 4,5 is as follows:

The substrate 1 is brought into position above the aligning and fixing devices 4,5 via conventional, non-illustrated means such as, for example, suction units or tongs. The substrate 1 is positioned as shown in FIG. 1 with the locating hole 2 in register with the peg 6c of the locating pin 6. The parts 6a,6b of the locating pin 6 abut one another under the action of the springs 11. The condition in which the parts 6a,6b abut one another is referred to as a contracted condition of the locating pin 6, and the springs 11 function to urge the locating pin 6 into this condition. In the contracted condition of the locating pin 6, the width or diameter d of the peg 6c is smaller than the diameter D of the locating hole 2.

The locating hole 3 of the substrate 1 is similarly in register with the peg 7c of the locating pin 7. The parts 7a,7b of the locating pin 7 abut each other under the action of the springs 11, and this condition is again referred to as a contracted condition of the locating pin 7. The width or diameter d of the peg 7c in the contracted condition of the locating pin 7 is smaller than the diameter D of the locating hole 3.

As illustrated in FIG. 1, the axis of the locating pin 7 and its peg 7c can, in practice, be horizontally offset relative to the axis of the locating hole 3. This can happen, for example, when the substrate 1 is subjected to deformation or undergoes a change in length due to temperature fluctuations.

In the position of FIG. 1, the substrate 1 rests on the vertically shiftable suction heads 21. To properly align and fix the substrate 1 in the screen printing machine preparatory to imprinting the substrate 1 with a printed circuit, the substrate 1 is moved downwards from the position of FIG. 1 to the position of FIG. 2. Since the suction heads 21 are vertically displaceable, the suction heads 21 follow the downward movement of the substrate 1 with accompanying compression of the springs 22. The downward movement of the substrate 1 causes the pegs 6c,7c to enter the respective locating holes 2,3.

Suction is applied to the channels 24 as indicated by the arrows in FIG. 2 so that the suction heads 21 grip the substrate 1. The application of suction to the substrate 1 makes it possible to compensate for small amounts of deformation of the latter. Thus, even if the substrate 1 undergoes a small amount of deformation, the suction applied via the channels 24 causes the substrate 1 to be deposited on the aligning and fixing devices 4,5 in such a manner that the locating holes 2,3 receive the pegs 6c,7c of the locating pins 6,7.

FIG. 2 again shows that, while the locating hole 2 of the substrate 1 is coaxial with the peg 6c of the locating pin 6, the axis of the peg 7c of the locating pin 7 is slightly offset with respect to the axis of the locating hole 3. However, due in part to the fact that the widths or diameters d of the pegs 6c,7c are smaller than the diameters D of the locating holes 2,3, and due in part to the presence of the suction heads 21, the pegs 6c,7c may be made to enter the locating holes 2,3 without any difficulty.

Once the substrate 1 has been positioned on the aligning and fixing devices 4,5 such that the pegs 6c,7c are received in the locating holes 2,3, compressed air is admitted into the cylinders 16 through the openings 18. This causes the pistons 15' to move upwards against the action, and with accompanying compression, of the springs 17. The upward movement of the pistons 15' results in upward movement of the rods 14 disposed in the passages 12 of the locating pins 6,7. When the conical tips 15 of the rods 14 come into engagement with the conical ends 13 of the passages 12, the parts 6a,6b of the locating pin 6, as well as the parts 7a,7b of the locating pin 7, are spread apart. Spreading of the parts 6a,6b and 7a,7b occurs against the action, and with accompanying compression, of the springs 11. The parts 6a,6b and 7a,7b are spread apart to such an extent that the pegs 6c,7c come into contact with the surfaces surrounding the respective locating holes 2,3. The condition in which the parts 6a,6b and 7a,7b contact the surfaces delimiting the locating holes 2,3 is referred to as an expanded condition of the locating pins 6,7.

FIG. 3 illustrates the expanded condition of the locating pins 6,7. The clearances which existed between the locating pins 6,7 and the sleeves 9 in the contracted condition of FIGS. 1 and 2 are smaller or non-existent in the expanded condition of FIG. 3.

As mentioned previously, the locating pin 6 is coaxial with the associated locating hole 2 of the substrate 1 whereas the locating pin 7 is eccentrically disposed with reference to the locating hole 3. Since the pegs 6c,7c have a width or diameter d of only a few millimeters, the peg 7c is subjected to deformation, and may even fracture, in this situation. To prevent deformation or fracture of the peg 7c under these circumstances, the invention provides for the support 8 of the aligning and fixing device 5 to be movable back-and-forth in a horizontal direction as indicated by the double-headed arrow f. This is accomplished via the parallel, horizontally disposed shafts 25,26 which are secured to the support 8 and are mounted for horizontal displacement in the bearings 27,28 carried by the fixed mounting member 29. Thus, when compressed air is admitted into the cylinder 16 of the aligning and fixing device 5 so that the parts 7a,7b of the locating pin 7 are spread apart through the action of the associated rod 14, the support 8, and hence the pin 7, are able to move slightly so as to compensate for the eccentricity of the pin 7 relative to the locating hole 3. This motion of the support 8 and the locating pin 7 arises because the peg 7c non-uniformly contacts the surface surrounding the locating hole 3 before the locating pin 7 reaches the fully expanded condition. In FIGS. 1 and 2, the contracted peg 7c is nearer the left-hand side than the right-hand side of the locating hole 3. Accordingly, when the locating pin 7 is expanded, the peg 7c initially comes into contact with the surface on the left-hand side of the locating hole 3 thereby causing a slight movement of the support 8 and pin 7 to the right. This movement, which takes place because the support 8 is carried by the horizontally shiftable shafts 25,26, compensates for the initial eccentric positioning of the axis of the locating pin 7 to the left of the axis of the locating hole 3.

FIG. 3 illustrates the position of the support 8 of the aligning and fixing device 5 subsequent to shifting of the support 8 to the right. In this displaced position of the support 8, the gap between the latter and the mounting member 29 is reduced as may be seen from a comparison of FIGS. 2 and 3. On the other hand, since the yoke 30 is shiftable with the support 8, the gap between the mounting member 29 and the yoke 30 in the displaced position of the support 8 shown in FIG. 3 is greater than that in the rest position of FIG. 2. The width of the gap between the support 8 and the mounting member 29 in the displaced position is denoted by x while the width of the larger gap between the mounting member 29 and the yoke 30 in the displaced position is denoted by x'.

As the support 8 of the aligning and fixing device 5 moves to the right, the spring or springs 31 are compressed while the spring or springs 32 expand.

Once the locating pins 6,7 are in the expanded condition, the substrate 1 is properly aligned and fixed relative to the printing drum of the screen printing machine. The substrate 1 may now be imprinted with a printed circuit.

Upon completion of the printing operation, the pressure at the openings 18 of the cylinders 16 is relieved. The springs 17 then urge the pistons 15' downwards which, in turn, causes the rods 14 to move downwards so that the conical tips 15 thereof move out of engagement with the conical ends 13 of the passages 12 in the locating pins 6,7. The springs 11 now urge the parts 6a,6b and 7a,7b of the locating pins 6,7 towards one another thereby causing the pins 6,7 to assume their contracted conditions. As the locating pin 7 contracts, the spring or springs 31 become free to expand and return the support 8 of the aligning and fixing device 5 to its initial or rest position. Once the locating pins 6,7 have contracted, the suction applied to the channels 24 is terminated and the downward pressure on the substrate 1 is discontinued. This allows the springs 22 to move the suction heads 21 upwards and permits the substrate 1 to be removed from the screen printing machine.

For each aligning and fixing device 4,5, the sleeve 9; the springs 11; the rod 14; the piston 15'; the cylinder 16; and the spring 17 together constitute an operating means for urging the respective locating pin 6,7 from the contracted condition to the expanded condition and vice versa.

FIG. 4 is a fragmentary plan view of FIG. 2 and shows the pegs 6c,7c after insertion in the locating holes 2,3 but before expansion of the locating pins 6,7. FIG. 4 illustrates with enhanced clarity that the peg 6c of the contracted locating pin 6 is coaxial with the associated locating hole 2 whereas the peg 7c of the locating pin 7 is eccentrically disposed with reference to the corresponding locating hole 3. As described above, the mounting of the support 8 of the aligning and fixing device 5 for horizontal displacement makes it possible to compensate for the eccentric disposition of the peg 7c relative to the locating hole 3.

FIG. 5 is a plan view of the locating hole 2 and the associated locating pin 6 in the position of FIG. 2, i.e., FIG. 5 shows the locating pin 6 subsequent to entry into the locating hole 2 but prior to expansion. The reference character T identifies the dividing plane between the parts 6a,6b of the locating pin 6 and it will be observed that the plane T constitutes a central axial plane of the locating pin 6. It will be further observed that the width or diameter d of the peg 6c is selected in such a manner that the peg 6c is receivable in the locating hole 2 with a certain amount of clearance s in the contracted condition of the locating pin 6. The width or diameter d of the peg 7c is selected similarly.

To prevent the peg 6c from contacting the surface which surrounds the locating hole 2 during introduction of the peg 6c into the hole 2, the end of the locating pin 6 which is provided with the peg 6c is advantageously machined in such a manner that the peg 6c defines a shoulder with the adjacent end face of the major portion of the locating pin 6. This is illustrated in FIG. 5 as well as in FIG. 7 which is a fragmentary perspective view of the locating pin 6 in the expanded condition. As most clearly seen in FIG. 7, the peg 6c projects from the end face of the major portion of the locating pin 6, and the region around the peg 6c constitutes a cutout which enables the peg 6c to be inserted in the locating hole 2 without contacting the surface around the hole 2.

FIGS. 4 and 5 show that the locating pin 6 has an elliptical or oval configuration. The peg 6c is thus most likely to contact the surface which surrounds the locating hole 2 at those points of the outer peripheral surface of the pin 6 located on the major axis of the ellipse. To insure that at least the clearance s exists all around the peg 6c when the latter is centrally positioned in the locating hole 2, the peg 6c is machined so as to eliminate the points of the outer peripheral surface which lie on the major axis of the ellipse. To this end, the peg 6c is formed with a pair of plane, generally parallel surfaces G which are normal to the major axis of the ellipse.

The locating pin 7 and its peg 7c have a configuration similar to that described with reference to FIGS. 4, 5 and 7 for the locating pin 6 and its peg 6c.

FIG. 6 is a view like that of FIG. 5 but shows the locating pin 6 in the expanded condition, that is, the condition in which the rod 14 has been moved upwards to spread the parts 6a,6b of the locating pin 6 apart. The arcuate portions of the outer peripheral surface of the peg 6c are here in surface-to-surface engagement with the surface surrounding the locating hole 2. In order to obtain intimate engagement between the arcuate outer peripheral surface portions of the peg 6c and the surface which surrounds the hole 2, the arcuate outer peripheral surface portions have a radius at least approximating that of the locating hole 2. The peg 7c is again similarly configurated.

Without further analysis, the foregoing will so fully reveal the gist of the present invention that others can, by applying current knowledge, readily adapt it for various applications without omitting features that, from the standpoint of prior art, fairly constitute essential characteristics of the generic and specific aspects of my contribution to the art and, therefore, such adaptations should and are intended to be comprehended within the meaning and range of equivalence of the appended claims.

I claim:

1. An arrangement for aligning a substrate preparatory to imprinting the latter with a printed circuit, the substrate having a plurality of locating holes, and said arrangement comprising a plurality of locating pins each of which has a longitudinal axis and an end portion; means mounting said locating pins to be positioned aligned with respective locating holes, each of said end portions including two unconnected sections constituting expandable means having a contracted condition in which the end portion is receivable in the respective locating hole with clearance, and further having an expanded condition; and operating means associated with each of said locating pins for urging the respective end portion from the contracted condition to the expanded condition and vice versa by translating the sections of each end portion substantially perpendicular to the respective longitudinal axis.

2. The arrangement of claim 1, wherein each of said locating pins is axially divided into at least two parts, the respective parts of each locating pin constituting relatively movable means for movement transverse to the pin between a first position in which the parts are nearer one another and a second position in which the parts are farther away from each other, and each of said end portions assuming the contracted condition in the first position of the respective parts and the expanded condition in the second position of the respective parts.

3. The arrangement of claim 2, wherein each of said locating pins is provided with an axially extending passage having a first end remote from and a second end nearer to the respective end portion, the second end of each passage converging in a direction towards the respective end portion, and each of said operating means including a rod in the respective passage, and moving means for moving the rod axially of the passage, each rod having a tip which faces the second end of the respective passage and converges in a direction towards the end portion of the respective locating pin.

4. The arrangement of claim 3, wherein the second end of each passage and the tip of each rod are substantially conical.

5. The arrangement of claim 3, wherein each of said moving means comprises a piston-and-cylinder unit, and each of said rods has a driven end which is fast with the piston of the respective unit.

6. The arrangement of claim 5, wherein said piston-and-cylinder units are pneumatic units.

7. The arrangement of claim 5, wherein each of said operating means comprises a resilient member which acts on the respective piston in a sense urging the tip of the respective rod away from the second end of the respective passage.

8. The arrangement of claim 7, wherein each of said resilient members comprises a spring.

9. The arrangement of claim 1, comprising a plurality of suction devices each of which is disposed next to a respective locating pin and is arranged to attract the substrate.

10. The arrangement of claim 9, comprising means supporting each of said suction devices for movement in a direction substantially parallel to said locating pins.

11. The arrangement of claim 10, wherein said mounting means is provided with a plurality of guide passages extending substantially parallel to said locating pins, each of said guide passages being disposed next to a respective locating pin and being connectible with a source of suction, and each of said guide passages accommodating a tubular member which is movable axially of the respective guide passage, each of said tubular members supporting a respective suction device.

12. The arrangement of claim 11, wherein each of said tubular members has a first end which carries the respective suction device, and a second end spaced from the first end; and further comprising a plurality of elastic elements each of which is located in a respective guide passage and engages the second end of the respective tubular member.

13. The arrangement of claim 12, wherein each of said elastic elements comprises a spring.

14. The arrangement of claim 1, said mounting means comprising a plurality of supports each of which carries a respective locating pin and the associated operating means; and further comprising means for displacing at least one of said supports transverse to the respective locating pin.

15. The arrangement of claim 14, comprising a pair of substantially parallel guide members on said one support, and bearing means mounting said guide members for movement in a direction transverse to the respective locating pin.

16. The arrangement of claim 1, wherein the dimensions of each of said end portions in the contracted condition are substantially smaller than the dimensions of the respective locating hole.

17. The arrangement of claim 1, wherein each of said locating pins has an end face and the respective end portion extends from and defines a shoulder with the end face.

18. The arrangement of claim 17, wherein each of said end portions is receivable in the respective locating hole with clearance along the entire length of the end portion.

19. An arrangement for aligning a substrate preparatory to imprinting the latter with a printed circuit, the substrate having a plurality of locating holes, and said arrangement comprising a plurality of locating pins each of which has an end portion; means mounting said locating pins to be positioned aligned with respective locating holes, each of said end portions constituting expandable means having a contracted condition in which the end portion is receivable in the respective locating hole with clearance, and further having an expanded condition, and each of said locating pins being axially divided into at least two parts, the respective parts of each locating pin constituting relatively movable means for movement transverse to the pin between a first position in which the parts are nearer one another and a second position in which the parts are farther away from each other, and each of said end portions assuming the contracted condition in the first position of the respective parts and the expanded condition in the second position of the respective parts, each of said locating pins being provided with an axially extending passage having a first end remote from and a second end nearer to the respective end portion, and the second end of each passage converging in a direction towards the respective end portion; and operating means associated with each of said locating pins for urging the respective end portion from the contracted condition to the expanded condition and vice versa, each of said operating means including a rod in the respective passage, and moving means for moving the rod axially of the passage, each rod having a tip which faces the second end of the respective passage and converges in a direction towards the end portion of the respective locating pin, and each of said moving means comprising a piston-and-cylinder unit, each of said rods having a driven end which is fast with the piston of the respective unit, and each of said operating means further including a guide for the respective locating pin, and biasing means on the guide arranged to urge the respective parts of the locating pin to the first position.

20. The arrangement of claim 19, wherein each guide comprises a sleeve which receives the respective locating pin with clearance in the first position of the respective parts.

21. The arrangement of claim 19, wherein each of said biasing means comprises at least one spring.

22. The arrangement of claim 19, each of said biasing means comprising a plurality of resilient biasing elements; and wherein each guide is provided with a plurality of bores extending radially of the respective locating pin and each bore accommodates a resilient biasing element.

23. An arrangement for aligning a substrate preparatory to imprinting the latter with a printed circuit, the substrate having a plurality of locating holes, and said arrangement comprising a plurality of locating pins each of which has an end portion; means mounting said locating pins to be positioned aligned with respective locating holes, each of said end portions constituting expandable means having a contracted condition in which the end portion is receivable in the respective locating hole with clearance, and further having an expanded condition; operating means associated with each of said locating pins for urging the respective end portion from the contracted condition to the expanded condition and vice versa, said mounting means comprising a plurality of supports each of which carries a respective locating pin and the associated operating means; means for displacing at least one of said supports transverse to the respective locating pin, said displacing means including a pair of substantially parallel guide members on said one support, and bearing means mounting said guide members for movement in a direction transverse to the respective locating pin, said one support having a rest position and a displaced position; and means for urging said one support to said rest position.

24. The arrangement of claim 23, each of said guide members having a projecting end on the side of said bearing means remote from said one support; and further comprising a yoke which connects said projecting ends with one another, said urging means including a pair of elastic members one of which is arranged between said bearing means and said yoke and the other of which is arranged between said bearing means and said one support.

25. The arrangement of claim 24, wherein each of said elastic members comprises a spring.

26. The arrangement of claim 24, said elastic members being prestressed; and wherein said elastic members are subjected to substantially identical prestresses and have substantially identical spring constants.

27. An arrangement for aligning a substrate preparatory to imprinting the latter with a printed circuit, the substrate having a plurality of locating holes, and said arrangement comprising a plurality of locating pins each of which has an end face, and an end portion extending from and defining a shoulder with the end face, of said end portions having a pair of plane, generally parallel surfaces; means mounting said locating pins to be positioned aligned with respective locating holes, each of said end portions constituting expandable means having a contracted condition in which the end portion is receivable in the respective locating hole with clearance, and further having an expanded condition; and operating means associated with each of said locating pins for urging the respective end portion from the contracted condition to the expanded condition and vice versa.

* * * * *